United States Patent [19]

Beery et al.

[11] Patent Number: 4,639,127
[45] Date of Patent: Jan. 27, 1987

[54] EXPOSURE APPARATUS FOR PRINTING SYSTEM

[75] Inventors: Jack Beery, Fremont; Barry G. Broome, Glendora, both of Calif.

[73] Assignee: ITT Corporation, New York, N.Y.

[21] Appl. No.: 807,417

[22] Filed: Dec. 10, 1985

[51] Int. Cl.$^4$ .................... G03B 27/72; G03B 27/76
[52] U.S. Cl. ..................... 355/35; 250/578; 350/355; 346/160; 355/71; 355/77; 358/75
[58] Field of Search ............... 355/4, 32, 35, 71, 77; 250/578; 350/355, 356; 346/107 R, 160; 430/138; 358/75

[56] References Cited

U.S. PATENT DOCUMENTS

| | | | |
|---|---|---|---|
| 3,912,391 | 10/1975 | Fleisher et al. | 355/77 |
| 4,229,095 | 10/1980 | Mir | 355/4 |
| 4,230,405 | 10/1980 | Kurtz | 355/4 |
| 4,367,925 | 1/1983 | Sprague et al. | 350/355 |
| 4,367,946 | 1/1983 | Varner | 355/71 |
| 4,370,029 | 1/1983 | Sprague et al. | 350/355 |
| 4,375,647 | 3/1983 | Mir | 358/75 |
| 4,375,648 | 3/1983 | Mir | 355/4 X |
| 4,375,649 | 3/1983 | Mir et al. | 355/32 X |
| 4,377,753 | 3/1983 | Mir | 250/578 |
| 4,378,568 | 3/1983 | Mir | 358/75 |
| 4,399,209 | 8/1983 | Sanders et al. | 430/138 |
| 4,413,270 | 11/1983 | Sprague | 346/160 |
| 4,416,966 | 11/1983 | Sanders et al. | 430/138 |
| 4,420,772 | 12/1983 | Jacobs | 358/294 |
| 4,440,846 | 4/1984 | Sanders et al. | 430/138 |
| 4,450,459 | 5/1984 | Turner et al. | 346/160 |
| 4,458,989 | 7/1984 | Tschang | 350/356 |
| 4,480,257 | 10/1984 | Hill | 346/107 R |
| 4,480,899 | 11/1984 | Sprague | 350/356 |
| 4,482,624 | 11/1984 | Arney et al. | 430/138 |
| 4,483,912 | 11/1984 | Sanders | 430/138 |
| 4,508,807 | 4/1985 | Adair | 430/138 |

Primary Examiner—Richard A. Wintercorn
Attorney, Agent, or Firm—T. L. Peterson; J. M. May

[57] ABSTRACT

Apparatus is described for exposing a layer of photosensitive material to form an image thereon, by passing the photosensitive layer under a row of closely spaced light shutter apertures which are selectively opened and closed. The total light falling on each pixel area at the photosensitive layer is increased by using apertures which are long and thin, and concentrating the light passing therethrough onto a pixel at the photosensitive layer. Two rows of staggered apertures are used. The photosensitive layer is on a transparent substrate, and a reflector lies on a side of the substrate opposite the light apertures, so light passing through the photosensitive layer and substrate is reflected back through the layer to pass twice therethrough. The entire sheet is pre-exposed to light of a level less than a threshold, with the light subsequently passing through each light aperture being sufficient to raise the total exposure beyond the threshold.

18 Claims, 12 Drawing Figures

EXPOSURE APPARATUS FOR PRINTING SYSTEM

BACKGROUND OF THE INVENTION

One technique for printing an image, especially one defined by video electrical signals, involves the opening of selected subminiature light shutter apertures that are arranged in a row across the path of a sheet containing a photosensitive layer. The apertures are in the form of subminiature circles, squares, or rectangles through which light falls onto pixel areas of comparable size on the sheet. For many photosensitive materials, considerable light is required for their exposure, and either the sheet must move slowly to obtain sufficient exposure of each area, or the light source must be very bright. Techniques for maximizing the utilization of the light source of given intensity, would enable lower intensity light sources and faster exposures of sheets, which would be useful not only for dot matrix type exposure but in other exposure applications.

SUMMARY OF THE INVENTION

In accordance with one embodiment of the present invention, an apparatus is provided for enhancing the exposure of a layer of photosensitive material to form an image thereon. Where a row of light shutters is used at an exposure station, to pass light through selected light shutter apertures onto subminiature dot areas of the photosensitive layer, each light shutter aperture can be elongated in the direction of movement of the photosensitive layer past the exposure station, and the light can be concentrated from the elongated narrow area onto dot areas on the photosensitive layer.

Two staggered rows of light shutter apertures can be used, with the signals representing alternate dot areas of the image along a row delivered to the first row of apertures at one time, and with signals representing the image at the in-between dot areas delivered to the second row after a time delay. The time delay equals the time required for the layer of photosensitive material to pass from under the first row to under the second row. The photosensitive layer can lie on a transparent substrate, and a reflector can lie under the substrate so light passes from a shutter through the substrate and photosensitive layer to the reflector, and is reflected to pass again through the photosensitive layer. All of the photosensitive layer can be exposed to a level less than a threshold at which the photosensitive material changes state; light delivered from the light shutters is sufficient to raise the total exposure beyond the threshold.

The novel features of the invention are set forth with particularity in the appended claims. The invention will be best understood from the following description when read in conjunction with the accompanying drawings.

BRIEF DESCRIPTION OF THE DRAWINGS

FIG. 5 is a side elevation view of a portion of the apparatus of FIG. 2, while

DESCRIPTION OF THE PREFERRED EMBODIMENTS

Figure 1:
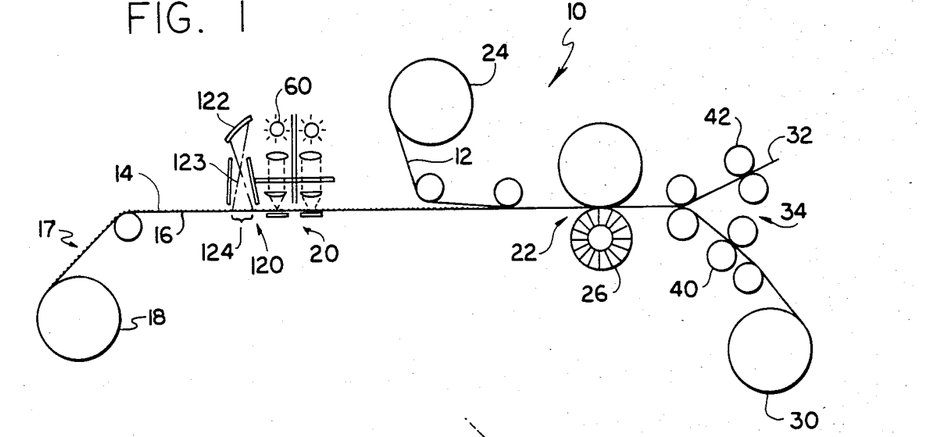
FIG. 1 is a simplified side elevation view of printmaking apparatus constructed in accordance with the present invention.

FIG. 1 illustrates a system 10 for printing images on an image-receiving sheet 12. A layer 14 of photosensitive material, carried by a backing sheet or substrate 16, passes along a layer path 17 from a storage roll 18 past an exposure station 20. At the exposure station, selected areas of the layer 14 are exposed to light in a pattern representing an image to be printed on the image-receiving sheet. The particular layer of photosensitive material 14 is in the form of microscopic dye-containing capsules which can be ruptured to release dye onto a sheet of paper. The capsules also include a photosensitive material which hardens the capsule contents. The contents of the capsules will not be released upon rupture when the photosensitive material has been exposed to a sufficient amount of light in the band of spectral sensitivity.

After exposure at 20, the photosensitive layer 14 is moved along the layer path to a transfer station 22. At the transfer station, the photosensitive layer 14 lies facewise adjacent to the image-receiving sheet 12, which has been deployed from a supply 24. At the transfer station, a brush 26 presses against the substrate sheet and ruptures the capsules. The dye or ink of each ruptured, unhardened capsule is available for transfer to the image-receiving sheet, the sum of the transferred dye forming the desired image. The substrate 16 with the ruptured capsules thereon is then wound up on a take-up roll 30. The image-receiving sheet with the images thereon is then delivered to an outlet 32 where it may, for example, be cut into individual short sheets. Both the backing and image-receiving sheets are moved at a controlled rate by a moving means 34 which includes a first pair of motor-driven rolls 40 which move the substrate and the photosensitive layer thereon, and a second pair of rolls 42 which move the image-receiving sheet at the same speed as the substrate.

Figure 2:
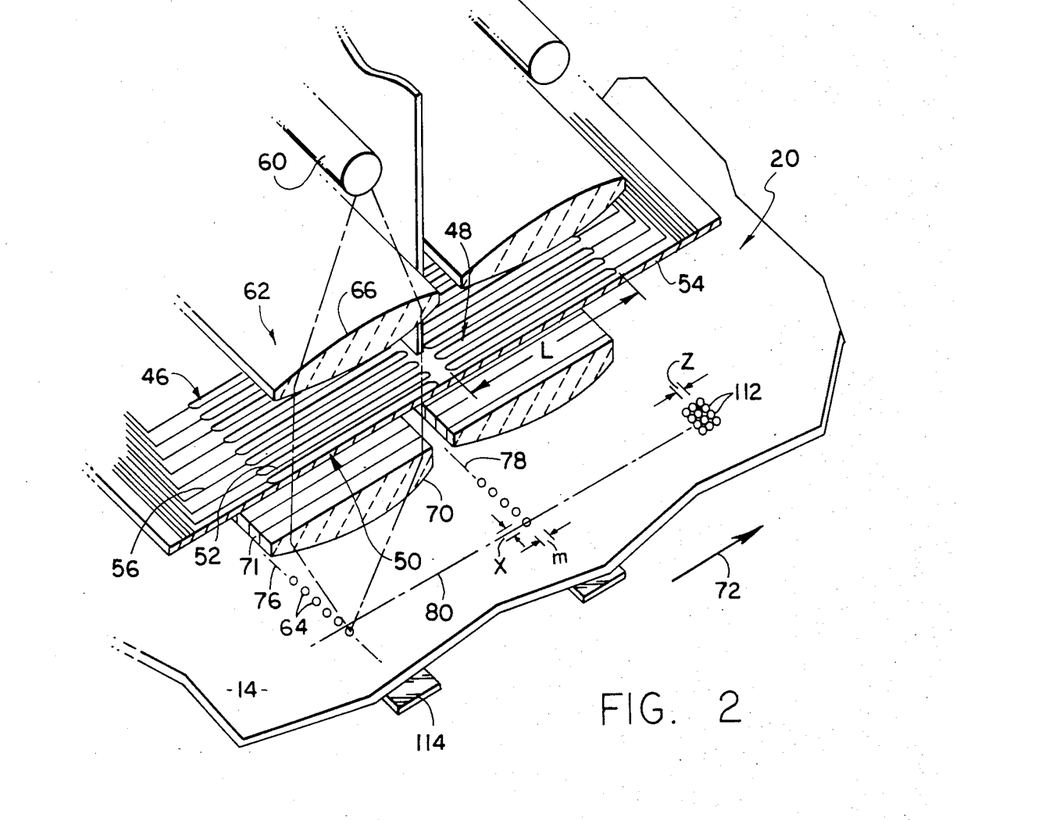
FIG. 2 is a partial perspective view of the exposure station of the apparatus of FIG. 1.

As shown in FIG. 2, the exposure station 20 includes two rows of light shutters 46, 48. Each light shutter such as 50 includes a light shutter aperture 52 defined on a plate 54 of liquid crystal display material, PLZT, or other shutter material. A pair of electrodes, such as of indium-tin oxide covers the opposite faces of the plate 54 at each light shutter aperture such as 52. In one arrangement, when a voltage is applied across the electrodes, the shutter aperture 52 becomes opaque. One electrode can be grounded, while the opposite electrode is connected to a processing circuit through a conductor 56, all of which is well known in the art.

When a shutter 50 is in an open condition, light from a source such as 60 can pass through the shutter aperture 52. A light directing means 62 directs light to each aperture 52 and from there to one of a row of pixels 64, or subminiature areas, at the location traversed by the photosensitive layer 14 in its passage through the exposure station. The light directing means is shown as including a cylindrical lens 66 for collimating light from the source 60 to direct it through the aperture 52. The light directing means includes another cylindrical lens 70 with barriers 71 therein for focusing light from each aperture onto the position of one of the pixels 64. The optics can consist of only a few cylindrical lens elements for a row containing a few thousand light shutters over a length of about one foot and a corresponding number of pixels.

Each pixel 64 is generally in the form of a circle or square having a length m parallel to the direction of photosensitive layer movement indicated by arrow 72 which is about equal to the width x of the pixel. (There are limited applications where a long pixel can be used.) The length m generally should be less than three times the width x in order that the exposed image will have a high degree of resolution along the length of the copy sheet as well as along its width. Applicant directs a large quantity of light from the source 60 to the dot area or dot of the layer 14 that lies at a pixel 64, by using light shutter apertures 52 that have a long length L parallel to the direction of layer movement, compared to the width of the aperture.

Figure 4:
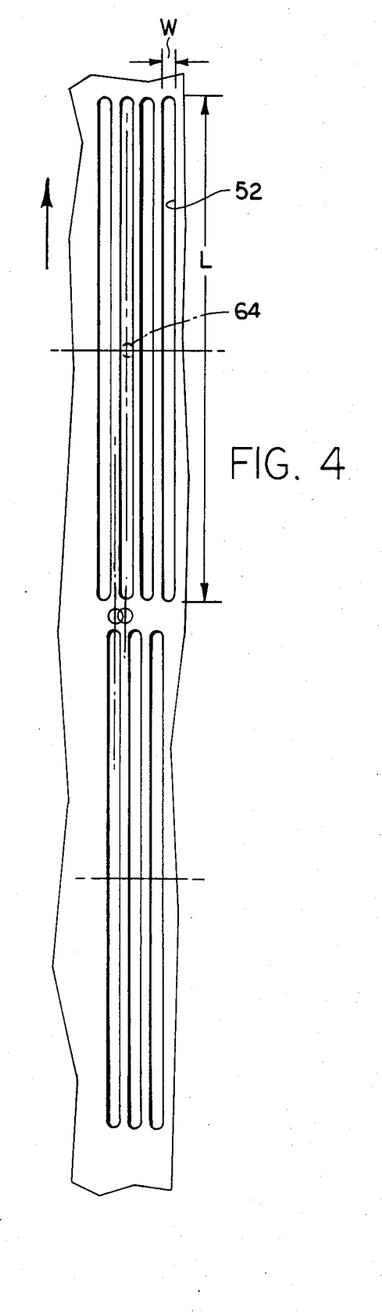
FIG. 4 is a plan view of the light shutters of the apparatus of FIG. 2.

FIG. 4 shows the general shape of each light shutter aperture 52, showing that its length L is many times greater than the width W of the area. In one system that applicant has designed, the width W of each light shutter area was 4.7 mil (1 mil equals one-thousandth inch) while the length L of the area was 500 mil, or in other words, about one hundred times as great. This results in about one hundred times as much light being concentrated onto a pixel 64, as would be obtained if the shape of the light shutter area 52 was approximately the same as that of the pixel 64. One or a few cylindrical lenses can collimate the light onto a row of thousands of light shutter apertures and then concentrate the light passing through each aperture onto a pixel 64.

It can be seen in FIG. 2 that the pixels 64 are spaced from one another along a pixel row line 76, there being a similar pixel row line 78 for the second row of pixels. The pixels 64 in the two rows 76, 78 are staggered, so that an imaginary line 80 extending parallel to the direction of layer movement can pass between a pair of pixels of the first row 76 and intersects a pixel of the second row 78. The light shutter apertures of the two rows of light shutters 46, 48 are similarly staggered.

Figure 3:
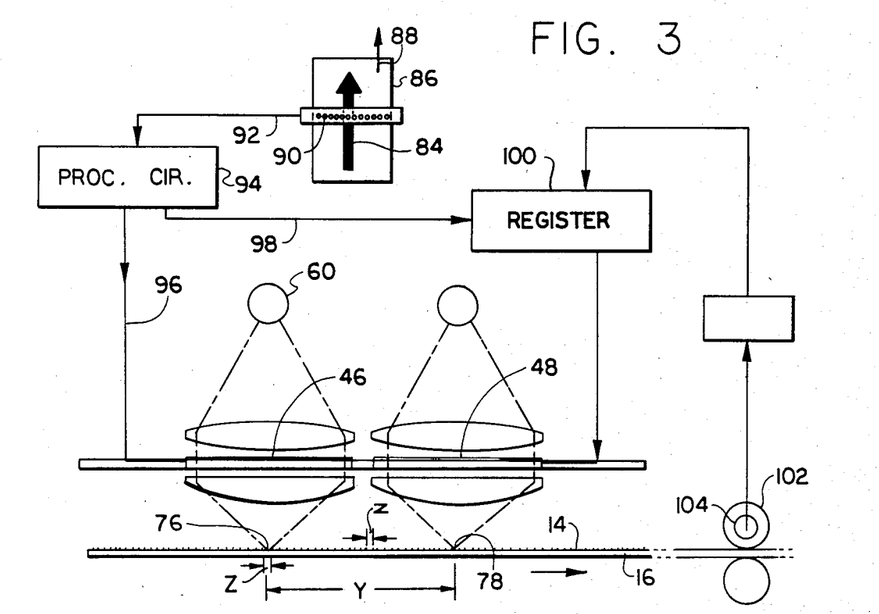
FIG. 3 is a side elevation view of the apparatus of FIG. 2, also including a block diagram showing circuitry used therewith.

FIG. 3 shows circuitry for operating the two rows of shutters 46, 48. In this figure it is assumed that the image is, as shown at 84, an arrow on an original 86. It is also assumed that signals representing this image are generated by moving the original in the direction of arrow 88 past a row 90 of photosensors which deliver signals representing the darkness at a multiplicity of points along a row. The output of the row of sensors is delivered over a communication link 92 to a processing circuit 94. The processing circuit delivers first signals representing the darkness of alternate points or dots on the original along conductor 96 to the first row of shutters 46, to open selected shutters in accordance with the darkness or lightness of pixels along a thin strip of the original 86.

The processing circuit 94 also delivers second signals along conductor 98 to a register 100, the signals along conductor 98 representing the darkness of areas of the original that lie between the alternate dots. The register holds the signals, and after a predetermined time delay delivers them to the light shutters of the second row 48. The predetermined time delay equals the time required for the layer 14 of photosensitive material to move a distance Y which equals the distance between the two rows of pixels 76, 78. A sensor circuit 104 coupled to a roller 102 in contact with the substrate and layer thereon can be used to sense movement of the layer; after each small movement of the layer 14 equal to the distance z between adjacent rows of pixels, the sensor circuit 104 delivers a pulse to the register 100. The register 100 stores a number of rows of signals equal to the number of rows of pixels in the distance Y. Thus, if the pixels are spaced apart a distance z equal to 3 mil and the distance Y is 500 mil, then signals on the line 98 will appear on the line 106 after 167 rows of signals have been delivered to the register 100. A register 100 which holds 167 bits can be clocked by the output of the sensor circuit 104 which delivers a pulse every time the layer 14 moves a distance of 3 mil.

Figure 5:
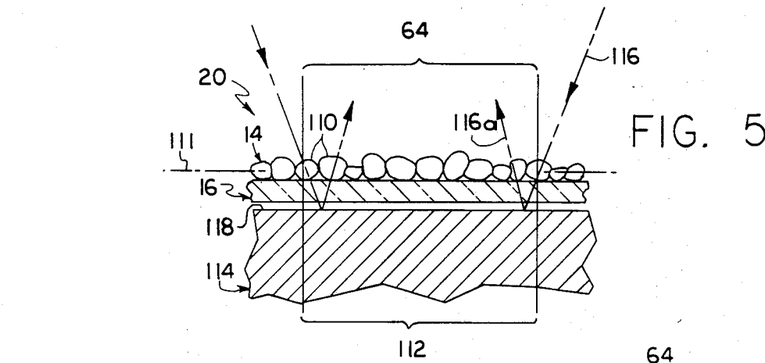

FIG. 5 illustrates one form of photosensitive layer 14 which comprises numerous capsules 110 mounted on the substrate 16. The layer is at the exposure station 20 where light is being directed onto a pixel 64, at a pixel plane 111 to expose a corresponding subminiature area or dot 112 of the photosensitive layer. In order to maximize exposure, the substrate 16 is formed of light transmitting material, and a reflector 114 is placed on a face of the substrate opposite the light source. As a result, an incoming light beam portion indicated by arrow 116 passes through the layer 114 and the substrate 16, and is reflected from the reflecting surface 118 of the reflector, to produce a reflected beam portion 116a that again passes through the photosensitive layer 14.

Figure 5A:
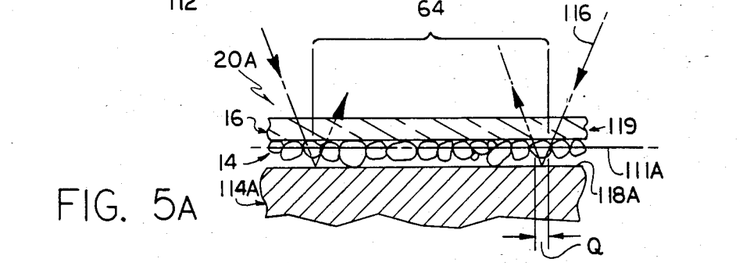
FIG. 5A is an alternative embodiment of that portion of the apparatus.

FIG. 5A illustrates another arrangement at an exposure station 20A, wherein the reflector 114A is on a side of the combination 119 of the substrate and photosensitive layer which is closest to the photosensitive layer 14. Converging light at 116 passes through the substrate 116 and layer 14 and is reflected from reflector surface 118A first through the layer 14. This arrangement has the advantage that the width Q of the perimeter of the pixel 64 exposed to one passage of light therethrough but not two passages of light, is minimized. However, care must be taken that considerable force is not applied to the layer 14 that might rupture capsules thereat.

Some photosensitive layers will retain an image only if the total amount of light falling on them exceeds a predetermined threshold. When exposed to light above the threshold, the photosensitive layer will undergo a reaction, while light below that level will not cause that reaction. In FIG. 5, each capsule 110 includes a photoinitiator which hardens the capsule (either by directly hardening the capsule contents or by initiating a secondary reaction which causes the hardening), to prevent release of any dye upon rupture, when light above a certain level is received by the capsule. For light below that level, the photoinitiator does not cause the reaction, and the capsule will rupture to release dye. The level of light required to produce the reaction is substantially equal to the integral of light intensity with time, over a time period of at least a few seconds for a typical photoinitiator in prior art capsules, and is substantially equal to the integral of light intensity with time over at least five minutes for at least some photoinitiators.

In order to minimize the amount of light that must be directed at a pixel 64, applicant includes an auxiliary photoreaction station such as shown at 120 in FIG. 1. At the auxiliary station 120, auxiliary light 120 from a light source 60 is directed, as by mirror 122, onto a strip 124 of the photosensitive layer 14. The auxiliary light is directed at a location adjacent to that portion of the layer which is at the primary exposure station 20 where light is concentrated onto individual pixels. The amount of auxiliary light or auxiliary integral of light intensity with time, to which the layer 14 is exposed at the auxiliary station 120 is an amount less than the threshold. However, the amount of auxiliary light is great enough that when the exposure at the auxiliary station 120 is added to the exposure at an exposed pixel area at the primary exposure station 20, the total exceeds the threshold. Thus, if the threshold is ten units, the auxiliary station 120 may expose the layer 14 to a level of eight units, while selected pixels at the exposed station 20 may each expose the layer to light of a level of four units. As a result, those areas of the layer 14 which have been exposed to light at a pixel, have received a total exposure of twelve units, which is above the threshold of ten units.

Figure 6:
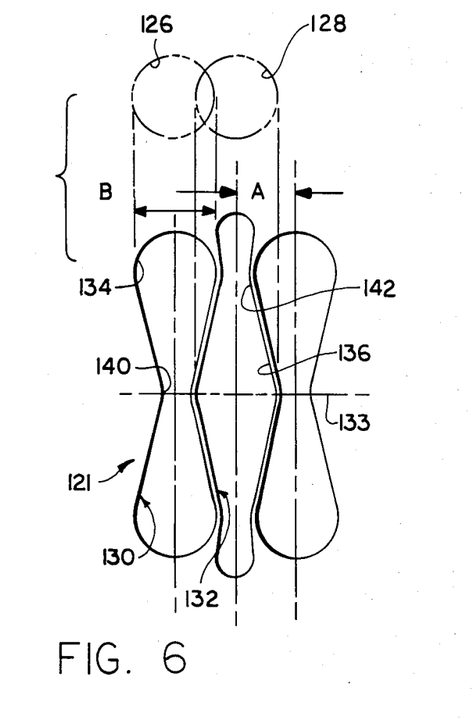
FIG. 6 is a plan view showing the general shape of light shutters in accordance with another embodiment of the invention.
Figure 7:
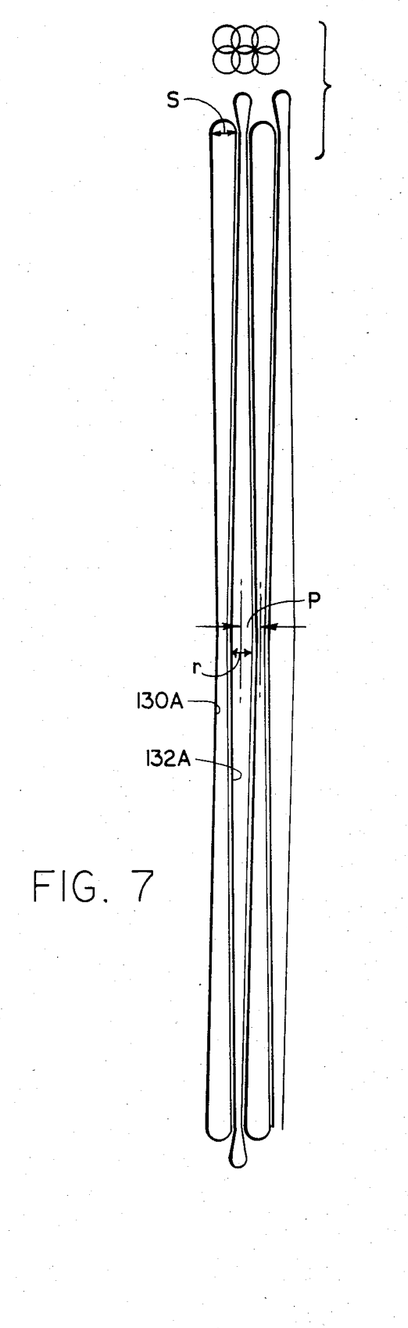
FIG. 7 is a plan view of the light shutters of FIG. 6 in an elongated configuration.

FIGS. 6 and 7 illustrate a portion of a row of light shutter apertures 121 which are arranged so that collimated light passing therethrough and concentrated by a cylindrical lens onto a pixel plane, will produce illuminated pixels shown at 126, 128 which overlap. The row includes two shapes of light shutter areas 130 and 132. Every other aperture along the row 133 has the shape 130, while every other one has the shape shown at 132. While the centers of the apertures are spaced apart along the row by the distance A, each aperture has a maximum width B which is greater than the spacing A. This causes the pixels 122, 124 to overlap even though they represent collimated light concentrated by a cylindrical lens onto a pixel plane. Each aperture has a wide portion 134 or 136, and a narrow portion 140 or 142. The narrow areas 140, 142 each have a width less than the spacing distance A. Where the first apertures 130 are wide, as at 134, the other apertures 132 are narrow, as at 142, and vice versa. Although the general shape of the apertures is shown in FIG. 16, a better indication of their shape is given in FIG. 7, which shows that each aperture 130A or 132A has a length along the direction of photosensitive layer movement, which is more than five times, and preferably more than ten times, the average width of the light shutter area.

Figure 8:
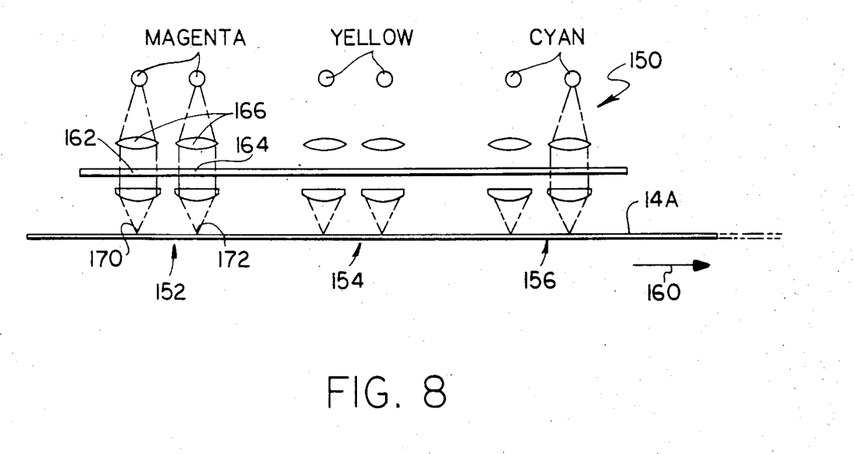
FIG. 8 is a side view of a color printing system constructed in accordance with another embodiment of the invention.

The dye-containing capsules of the type shown at 110 in FIG. 5, can be filled with dyes of different colors, such as magenta, yellow, and cyan, to print any of a wide range of colors on the image-receiving sheet. It may be noted that these colors are combined subtractively to produce a wide range of colors. Also, instead of three colors, two colors (e.g., black and red), or four colors (e.g., magenta, yellow, cyan, and black for good color and text printing) or even more, can be used. Each capsule of this system includes a photoinitiator which is more sensitive to light of a given wavelength than the photoinitiators of other capsules that contain dye of a different color. In that case, the system 150 shown in FIG. 8 can be used to expose a layer 14A of photosensitive material to light of three different colors. The system includes three different exposure stations 152, 154, 156 spaced along the direction of photosensitive layer movement indicated by arrow 160. The number of exposure stations equals the number of different colors used. Each station includes a pair of rows of light shutters 162, 164. Three pairs of light directing means such as 166 are provided, each directing light of a different spectral band centered on a different wavelength. The light is directed at a corresponding pair of rows of light shutters such as 162, 164 for passing the light through open shutters and onto a pair of pixel areas such as 170, 172. A circuit of the type shown in FIG. 3 is used to time the opening of the light shutters.

Figure 9:
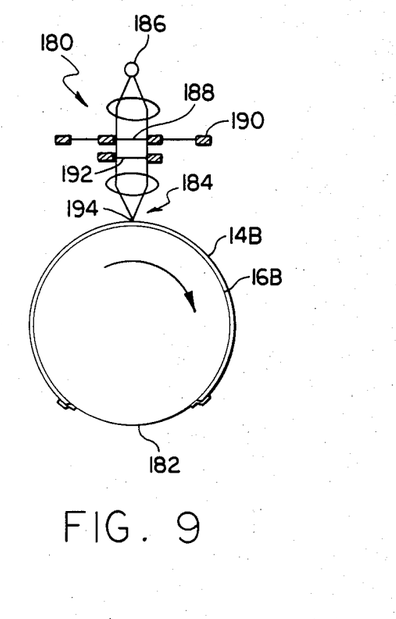
FIG. 9 is an end view of a color printing system constructed in accordance with another embodiment of the invention.

FIG. 9 illustrates another system 180 for exposing each of numerous pixels of layer 14B of photosensitive material, to light of a selected one of three colors or a selected combination of colors. The layer 14B lies on a substrate 16B temporarily held on a rotatable drum 182. As the drum rotates, it moves successive rows of pixels on the layer past an exposure station 184. A light generating means at 185 at the exposure station includes a white light source 186 containing all three wavelengths or colors to be applied to the layer, and a filter device 190. At the exposure station light from the white light source 186 passes through one color filter 188 of the filter device 190. The filter device 190 includes three color filters that each pass substantially only one spectral band of light thereby hardening the contents of the magenta, yellow, or cyan producing photo capsules. The light is directed at a row of individually operable shutters 192 to pass through those shutters which are open onto pixels 194 on the layer 14B. After each revolution, the filter device is shifted so a different filter lies between the light source and the shutters. After three revolutions, the substrate is removed for a next step of rupturing the capsules of the layer 14B against an image-receiving sheet.

Figure 10:
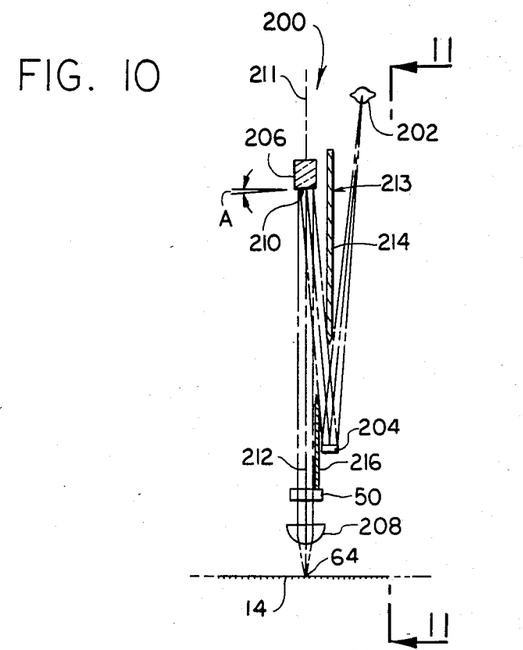
FIG. 10 is a side elevation view of an optical light directing system of another embodiment of the invention.
Figure 11:
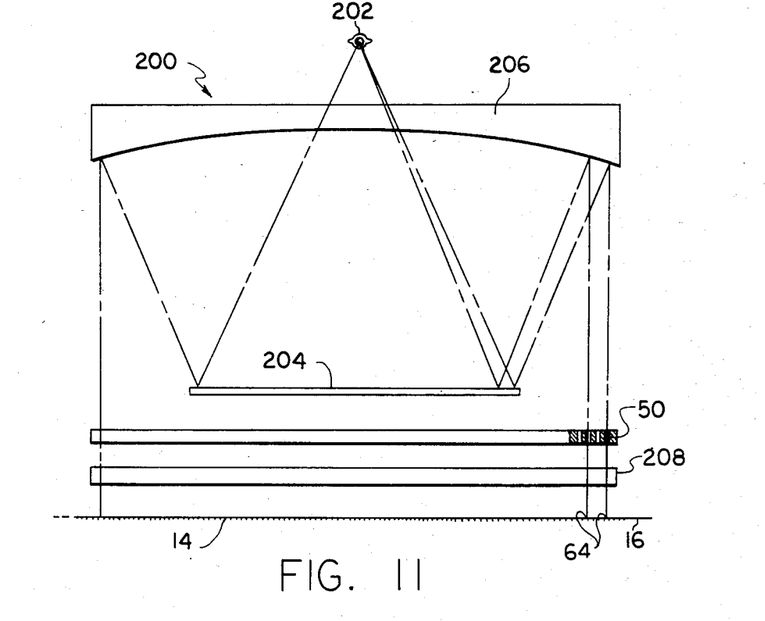
FIG. 11 is a view taken on the line 11—11 of FIG. 10.

While FIG. 2 shows one optical system for directing light from a source through the shutter apertures, applicant has developed an improved optical system 200 shown in FIGS. 10 and 11. In the improved system light from an arc lamp source 202, which is a substantially point source, is reflected from a flat folding reflector 204 toward a concave substantially spherical reflector 206 that extends substantially parallel to the folding reflector. The concave reflector collimates the light and directs it at the row of shutters 50. Light passing through open shutters is concentrated by a cylindrical lens 208 at pixels 64 on the layer 14 which is on the substrate 16. As shown in the two FIGS. 10 and 11, the light is collimated along two perpendicular planes so almost all light on a pixel has passed through a single shutter.

As can be seen in FIG. 10, the light source 202 and folding reflector lie out of the common plane 211 of light at 212 passing through the shutters 50. Also, the concave reflector surface 210 is tilted by an angle A from an orientation perpendicular to the collimated light at 212 passing through the shutters. To avoid stray light, a baffle device 213 is positioned so its pair of baffles 214, 216 lie on opposite sides of light passing between the folded mirror 204 and the spherical reflector, to block all but an elongated narrow band of light. The baffles 214, 216 lie in different planes.

Thus, the invention provides apparatus for a printing system, for facilitating the exposure of a light sensitive layer to light in a pattern representing an image to be printed. Where light passes through a row of shutters, an increased amount of light can pass through each shutter by making it elongated, preferably in the direction of light sensitive layer movement. Two staggered rows of shutters can be used, along with circuitry for delivering signals to the second row of shutters representing alternate dot areas of the image, after a time equal to the time required for the photosensitive layer to move from a first row of pixels under the first row of shutters to a second row of pixels under the second row of shutters. The photosensitive layer can be mounted on a light transmitting substrate, and a reflector is placed on a face of the substrate-layer combination opposite the light source, to reflect light back through the light sensitive layer. Where the photosensitive layer includes a photoinitiator that is triggered to react when the integral of light with time exceeds a threshold, an auxiliary photoreaction station can be used to expose the layer to a level below the threshold, with light at the exposure station exposing selected areas of the layer to sufficient additional light to raise it above the threshold.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Apparatus for selectively exposing each of a multiplicity of subminiature areas of a photosensitive layer of photosensitive material, to light, comprising:
   means defining an exposure station for positioning a photosensitive layer to be exposed;
   means for moving the photosensitive layer in a predetermined direction past said exposure station;
   a row of independently operable light shutters, each shutter including a shutter area and being independently operable to an open state to pass light through a corresponding shutter area, and to a closed state to substantially block the passage of light through the shutter area;
   means for directing light at the locations of said shutter areas, and for focusing light that passes through the shutter area of each open shutter onto a different pixel of a row of pixels that lie at the position of a photosensitive layer at the exposure station, said row of pixels extending largely perpendicular to the direction of movement of said layer past said exposure station;
   each shutter area having a length which is a plurality of time greater than its average width, and said focusing means focuses light passing through each shutter area onto a corresponding one of said pixels, said corresponding one having a length parallel to the direction of movement of the layer which is less than the length of said each shutter area.

2. The apparatus described in claim 1 wherein:
   said shutter area has a length parallel to the direction of movement of said photosensitive layer, which is at least five times its average width, and each pixel has a length parallel to the direction of movement of the layer which is less than three times the width of the pixel in a direction perpendicular to the direction of layer movement.

3. The apparatus described in claim 1 including:
   a second row of independently operable second light shutters similar to the first row, and having shutter areas;
   said light directing means directs light at the locations of said second shutters and focuses light that passes through each shutter area of the second row, onto a different pixel of a second row of pixels that is spaced downpath, along the direction of layer movement, from the first named row of pixels;
   said pixels of the first row being spaced apart along the row, and the pixels of the second row being staggered along the direction of layer movement, with respect to the pixels of the first row so that if the pixels of the first row were moved along the direction of layer movement by a predetermined distance, the pixels of the second row would be substantially centered between the pixels of the first row;
   means for generating signals representing the opacity, of at least one color, or a row of minute areas extending across a width dimension of an image to be printed;
   means coupled to said signal generating means for delivering first shutter opening signals representing the opacity of every other one of said minute areas, to the shutters of said first row, to operate each shutter of the first row in accordance with the opacity of a corresponding minute area, and for delivering second shutter operating signals representing the opacity of the minute areas in between said every other minute areas, to the second shutters at a later time to operate them at said later time;
   said later time equaling the time required for a point on said layer to move said predetermined distance between said first and second rows of pixels.

4. The apparatus described in claim 1 wherein:
   the centers of said shutter areas are spaced apart along said row by a predetermined spacing distance, and each shutter area has wide and thin portions at different locations along its length, the wide portions having a width greater than said spacing distance, and the narrow portions having a width less than said spacing distance;
   alternate shutter areas along said row being of substantially the same shape and centered on an imaginary row line extending along the row, and the shutter areas between said alternate shutter areas each having a narrow portion lying between the wide areas of the two adjacent alternate shutter areas.

5. The apparatus described in claim 1 wherein:
   the centers of said shutter areas are spaced apart along an imaginary line extending along said row, alternate shutter areas each have narrow centers and wider opposite end portions, and the shutter areas between said alternate shutter areas have wide centers and narrower opposite end portions.

6. The apparatus described in claim 1 including:
   a substrate which passes light;
   said photosensitive layer comprises a multiplicity of photosensitive capsules mounted to a face of said substrate, and said moving means is constructed to move said substrate with the layer of capsules thereon past said exposure station; and
   a reflector positioned on a face of said substrate which is opposite said light focusing means, said reflector positioned to reflect light which has passed from said light directing means and through said substrate and layer of capsules, back towards said substrate and layer of capsules, whereby to increase the exposure of said capsules.

7. The apparatus described in claim 1 including:

a substrate;

said photosensitive layer includes a photoinitiator which undergoes a predetermined reaction to light which causes said layer to be incapable of releasing dye to print, only if an integral of light intensity with time, of light received during a period of time of at least a microsecond exceeds a predetermined threshold, said layer being capable of releasing dye to print if the integral of light intensity with time does not exceed said threshold;

means for operating selected shutter areas to open them and expose subminiature areas of the photosensitive layer lying at corresponding pixels, for a period of limited duration;

said light directing means, moving means and shutter area formed so the integral of light intensity with time in each exposed area of the layer at a pixel is less than said threshold; and means defining an auxiliary exposure station spaced along the direction of layer movement from said pixels at said exposure station, for exposing said layer in an amount less than said threshold, but great enough that when the exposure at said auxiliary station is added to the exposure of an exposed area at said exposure station the total exceeds said threshold.

8. Apparatus for printing an image by selectively exposing each of a multiplicity of minute areas of a photosensitive layer of photosensitive material, to light, comprising:

means defining an exposure station which includes first and second exposure locations;

means for moving the photosensitive layer in a predetermined direction past said first and second exposure locations in sequence;

first and second rows of light shutters lying respectively opposite said first and second exposure locations, each shutter including a shutter area and each shutter being independently operable with respect to a majority of the other shutters to open and closed states to respectively pass and block light passage through its shutter area;

means for directing light at each shutter area and for passing light therethrough, when the shutter area is open, onto a pixel area lying at a corresponding one of said exposure stations, the pixel areas arranged in first and second parallel rows, one row at each exposure station with pixels spaced apart at each row, and the pixels in the two rows being staggered so if the pixels on the first row were moved along said predetermined direction of layer movement by a predetermined distance, the pixels of the second row would substantially cover the spaces between the pixels of the first row;

means for generating signals representing the opacity, of at least one color, of a row of minute areas extending across an image to be printed;

means coupled to said signal generating means for delivering first shutter operating signals representing the opacity of every other one of said minute areas, to the shutters of said first row, to operate each shutter of the first row in accordance with the opacity of a corresponding minute area, and for delivering second shutter operating signals representing the opacity of the minute areas in between said every other minute areas, to the second shutters at a latter time to operate them at said later time;

said later time equaling the time required for a point on said layer to move said predetermined distance between said first and second rows of pixels.

9. The apparatus described in claim 8 wherein:

said photosensitive layer includes at least three different photosensitive materials in each minute area, each material being more sensitive to light of one of three different wavelengths than the other materials;

means defining three different exposure stations, including said first named station and two other stations spaced from one another along said predetermined direction of movement, each station including first and second exposure locations;

three pairs of rows of light shutters, including said first and second rows and two other similar pairs of rows, each pair of rows lying opposite a corresponding one of said exposure stations;

three light directing means, including said first named light directing means and two others, each light directing means directing light in a spectral band centered on one of said three wavelengths at a corresponding pair of rows of light shutters, for passing light through open shutters of the two rows of the pair onto a pixel area at the exposure station to expose minute areas of the photosensitive materials lying thereat.

10. Apparatus for exposing a layer of photosensitive dye-containing capsules, with light representing an image, comprising:

a substrate having front and rear faces, said layer of capsules mounted on the front face of said substrate;

means for directing light at selected portions of said layer of capsules representing said image;

said substrate being transparent; and a reflector positioned on a side of said substrate opposite said light directing means, to reflect light which has passed once through the capsule layer and substrate, back through the capsule layer to increase the exposure of the capsules.

11. The apparatus described in claim 10 wherein:

said front face on which said layer of capsules is mounted, faces said reflector, so said layer of capsules is closer to said reflector than is said substrate.

12. Apparatus for exposing a layer of photosensitive dye-containing capsules, with light representing an image wherein the capsules include a photoinitiator which undergoes a predetermined reaction to light only if an integral of light intensity with time exceeds a predetermined threshold, said capsules being capable of releasing dye when crushed only if the integral of light intensity with time does not exceed said threshold, comprising:

means defining an exposure station;

means for moving said layer past said exposure station;

means for applying light selectively to at least part of the area of said layer of capsules at said station which represent said image, of an amount which is less than said threshold; and means for exposing said layer of capsules to auxiliary light within 5 minutes of exposure of said layer at said exposure station, including exposing areas representing said image and areas lying beside areas representing said image with auxiliary light in an amount less than said threshold but great enough that when added to an exposure of an exposed area at said exposure station, the total exceeds said threshold.

13. In a system for printing a multi-colored image by moving a layer of photosensitive material past an exposure station and directing light from a light-generating means through selected ones of a multiplicity of shutters onto said layer, wherein said photosensitive layer includes a plurality of different photosensitive materials that are each sensitive primarily to a different one of a plurality of different spectrums of light, the improvement wherein:

said light generating means includes a light source that generates all of said plurality of spectrums and a filter device that includes a plurality of filters that each pass substantially only one of said spectrums of light; and including means for moving said layer a plurality of times past said exposure station;

said filter device including means for positioning a different one of said filters in a position in the path of light moving from said light source through said shutters to said layer, at each of the movements of said layer past said exposure station.

14. In a system for exposing each of a multiplicity of selected subminiature areas of a photosensitive layer by directing light onto each of a plurality of shutters and opening selected shutters to pass light through each open shutter to a corresponding subminiature area of the layer, the improvement wherein:

each shutter includes a shutter area having a length which is more than five times its width, and said system includes means for concentrating the light passing through each shutter area onto a subminiature area of the layer which has a length less than three times its width.

15. In a system for printing an image by moving a layer of photosensitive material containing dye along a layer path past a primary exposure station, exposing said layer at said primary exposure station to light in a predetermined pattern representing said image, and then printing an image on an image-receiving sheet corresponding to said predetermined pattern, wherein each subminiature area of said photosensitive material prints only if exposed to less than a predetermined threshold equal to an integral of light intensity with time, and will not print if exposed to more than said threshold, the improvement wherein:

the integral of light with time applied to subminiature areas of said layer at said exposure station is less than said threshold; and including means defining an auxiliary exposure station for exposing substantially all of the area of said layer which can be exposed at said primary exposure station, to light whose integral of intensity with time is less than said threshold but which when added to the integral of intensity with time applied at said primary exposure station exceeds said threshold.

16. In a system for exposing each of a multiplicity of selected subminiature areas of a photosensitive layer by directing light through selected ones of a multiplicity of shutters lying in a row onto the layer, the improvement of an apparatus for providing said light comprising:

a substantially point source of light;

a first elongated reflector;

a second elongated reflector which is concave and which extends largely parallel to said first reflector;

said reflectors positioned so light from said source is reflected from said first reflector toward said second reflector, and from said second reflector through the open shutters of said row of shutters, said second reflector curved to collimate the light passing from it toward said shutters;

said row of shutters and second reflector laying in a common plane but said source and first reflector lying out of said common plane; and a baffle device which passes an elongated narrow band of light from said first reflector towards the vicinity of said second reflectors.

17. A method for exposing each of a multiplicity of selected subminiature areas of a photosensitive layer by directing light from a source onto each of the areas, the improvement comprising:

repeatingly controlling the passage of light through each of a multiplicity of elongated shutter areas that are arranged in a row and that each has a length more than five times its average width, to pass light through some of the shutter areas but not others:

moving said layer past an exposure location;

concentrating the light passing through each of said elongated shutter areas onto a corresponding subminiature area of said layer which lies at said exposure station, wherein each subminiature area has a length less than three times its width.

18. In a method for printing by exposing to light a layer of photosensitive material with dye which can print if not exposed to an integral of light intensity with time which exceeds a predetermined threshold, and which cannot print if exposed to an integral of light intensity exceeding said threshold, by moving the layer past an exposure station and at said station not exposing certain areas of said layer which are to print a desired image while exposing areas between and outside of said certain areas, the improvement comprising:

exposing substantially all of said layer to an auxiliary integral of light intensity with time which is less than said threshold; and exposing said certain areas of said layer which are not to be printed, at said exposure station, to an integral of light intensity with time which is less than said threshold, but which when added to said auxiliary integral exceeds said threshold.

* * * * *